(12) United States Patent
Zaal

(10) Patent No.: US 9,799,629 B2
(45) Date of Patent: Oct. 24, 2017

(54) INTEGRATED CIRCUIT DIES WITH THROUGH-DIE VIAS

(71) Applicant: NXP B.V., Eindhoven (NL)

(72) Inventor: Jeroen Johannes Maria Zaal, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/041,483

(22) Filed: Feb. 11, 2016

(65) Prior Publication Data

US 2017/0236803 A1    Aug. 17, 2017

(51) Int. Cl.

| | |
|---|---|
| *H01L 21/02* | (2006.01) |
| *H01L 21/48* | (2006.01) |
| *H01L 21/56* | (2006.01) |
| *H01L 29/02* | (2006.01) |
| *H01L 25/065* | (2006.01) |
| *H01L 21/768* | (2006.01) |
| *H01L 23/48* | (2006.01) |
| *H01L 25/00* | (2006.01) |

(Continued)

(52) U.S. Cl.
CPC ........ *H01L 25/0655* (2013.01); *H01L 21/561* (2013.01); *H01L 21/76898* (2013.01); *H01L 21/82* (2013.01); *H01L 23/3107* (2013.01); *H01L 23/481* (2013.01); *H01L 23/66* (2013.01); *H01L 24/11* (2013.01); *H01L 24/17* (2013.01); *H01L 24/81* (2013.01); *H01L 24/94* (2013.01); *H01L 25/50* (2013.01); *H05K 1/181* (2013.01); *H05K 3/32* (2013.01); *H01L 2223/6677* (2013.01); *H01L 2224/13025* (2013.01); *H01L 2224/16225* (2013.01); *H01L 2924/14* (2013.01)

(58) Field of Classification Search
CPC ............. H01L 2924/14; H01L 2224/94; H01L 21/561; H01L 2224/05571; H01L 2224/03; H01L 21/76898; H01L 23/481; H01L 21/6836; H01L 25/00; H01L 23/49827; H01L 23/5226; H01L 2223/5446; H01L 23/3114; H01L 2224/13025; H01L 21/486; H01L 25/50; H01L 24/94; H01L 24/11; H01L 25/0655; H01L 2924/181; H05K 1/18
See application file for complete search history.

(56) References Cited

U.S. PATENT DOCUMENTS

| 8,367,471 B2* | 2/2013 | Pratt | ........ H01L 21/563 257/686 |
|---|---|---|---|
| 8,729,679 B1 | 5/2014 | Phua | |

(Continued)

*Primary Examiner* — Jasmine Clark

(57) ABSTRACT

Aspects of the disclosure are directed to integrated circuit dies and their manufacture. In accordance with one or more embodiments, a plurality of integrated circuit dies are provided in a semiconductor wafer, with each integrated circuit die having: an integrated circuit within the die, a via extending from a first surface to a second surface that opposes the first surface, and first and second electrical contacts at the first surface respectively coupled to the via and to the integrated circuit. Lanes are created in a front side of the wafer between the dies, and a portion of the back side of the wafer is removed to expose the lanes. A further contact and/or via is also exposed at the backside, with the via providing an electrical signal path for coupling electrical signals through the integrated circuit die (e.g., bypassing circuitry therein).

12 Claims, 11 Drawing Sheets

(51) Int. Cl.
*H01L 23/00* (2006.01)
*H01L 21/82* (2006.01)
*H01L 23/66* (2006.01)
*H05K 3/32* (2006.01)
*H05K 1/18* (2006.01)
*H01L 23/31* (2006.01)

(56) References Cited

U.S. PATENT DOCUMENTS

| | | | |
|---|---|---|---|
| 8,963,336 B2 * | 2/2015 | Jung | .............. H01L 24/96 |
| | | | 257/774 |
| 9,196,537 B2 | 11/2015 | Van Gemert et al. | |
| 2014/0110842 A1 | 4/2014 | Zenz et al. | |
| 2014/0138855 A1 | 5/2014 | Van Gemert et al. | |

* cited by examiner

INTEGRATED CIRCUIT DIES WITH THROUGH-DIE VIAS

OVERVIEW

Aspects of various embodiments are directed to apparatuses and methods involving integrated circuit dies, which provide electrical access through the dies (e.g., as a bypass) that may be used for coupling signals to further/external stacked circuits.

Such aspects may be amenable to implementation with wafer level chip scale packaging (WLCSP), and can address various challenges associated therewith. For instance, integrated circuit (IC) dies (which can be referred to as chips) are often produced by forming a plurality of individual ICs within a semiconductor substrate, such as a silicon wafer. The ICs are then separated from one another, such as by sawing/cutting through the silicon wafer and between the ICs, and perhaps removing a portion of the wafer, to form individual IC dies.

These approaches can be used to form relatively thin, small packages. However handling small dies, and particularly thin dies, during testing and other manufacturing processes can cause damage. In addition, it can be challenging to further implement such dies for a wide variety of applications, where the dies are to be coupled to different types of circuitry to suit particular needs. Further, as the number of electronic devices per given area of the silicon wafer increases, the manufacturing process becomes more difficult, particularly in relation to the above issues.

These and other matters have presented challenges to efficiencies of integrated circuit implementations, for a variety of applications.

SUMMARY

Various example embodiments are directed to apparatuses and/or methods involving integrated circuit dies, including such dies as may be manufactured in a wafer-level chip scale package. One or more vias through the dies facilitate coupling of stacked circuits on the dies such as another die or an antenna. This approach may be implemented, for example, to provide compact stacking height and related coupling of signals to the stacked structure at a common surface, such as with solder bumps on an underlying side of the dies and that respectively couple signals to integrated circuitry within the die as well as to the circuit stacked above the dies and coupled by the vias. Further, such approaches may be implemented for a variety of technologies, such as those involving mobile payment in which stacked dies can be implemented separately and/or with antennas stacked on dies in a compact manner. For instance, mobile payment applications can be implemented with separate circuits/dies that carry out certain secure functions, relative to other circuitry within a mobile device can be arranged with stacked componentry as characterized herein.

A more particular embodiment is directed to a method for manufacturing integrated circuit dies from a semiconductor wafer, with each integrated circuit die having: an integrated circuit within the die, a via extending from a first surface to a second surface that opposes the first surface, and electrical contacts at the first surface respectively coupled to the via and to the integrated circuit. Portions of the semiconductor wafer are removed between the dies to create lanes (e.g., trenches), such as by sawing or etching the wafer. A portion of the semiconductor wafer (e.g., at a backside underlying the dies) is then removed to expose the lanes, with a third contact to the via in each integrated circuit die being provided at the second surface (e.g., by exposing the via during a wafer grinding process). This third contact is operable with the first contact and the via to provide an electrical signal path for coupling electrical signals through the integrated circuit die. This signal path may thus bypass the integrated circuit within the die, providing for electrical access to both the integrated circuit and other circuitry stacked upon the die by way of the first and second electrical contacts.

Another embodiment is directed to a method as follows. A plurality of integrated circuit dies are formed in a semiconductor wafer. For each integrated circuit die, a via is formed extending from a first surface of the die into the integrated circuit die, and a plurality of electrical contacts are formed at the first surface. A first one of the electrical contacts is coupled to the via, and a second one of the electrical contacts is coupled to an integrated circuit in the integrated circuit die. The integrated circuit dies are separated from one another by creating saw lanes in the wafer, removing a portion of the semiconductor wafer, and therein exposing a second surface of each integrated circuit die that opposes the first surface. The via is also exposed at the second surface, and a further circuit is connected to the via at the second surface. This further circuit is separate from the integrated circuit die and coupled to the first one of the electrical contacts by the via, therein providing an electrical signal path for coupling electrical signals between the first one of the electrical contacts at the first surface and the further circuit at the second surface.

In some implementations, each integrated circuit die and the further circuit coupled thereto are encapsulated with an encapsulation material that extends around the integrated circuit dies and within the saw lanes. The integrated circuit die and the further circuit coupled thereto are then separated by sawing through the encapsulation material in the saw lanes. In this context, a compact stacked structure is provided with electrical access to both the integrated circuit and the further circuit (as encapsulated), via the first and second contacts at the first surface. In certain embodiments, each integrated circuit and the further circuit connected to the integrated circuit die are coupled to an underlying circuit board via the first and second contacts.

Another embodiment is directed to an apparatus that includes a plurality of integrated circuit dies in a semiconductor wafer, with each integrated circuit die being separated from other ones of the integrated circuit dies by lanes in portions of the semiconductor wafer between the dies. Each integrated circuit die has an integrated circuit within the die, first and second surfaces that oppose one another, and a via extending through the die from the first surface to the second surface. Each integrated circuit die has external contacts on the first surface, with a first one of the external contacts being connected to the via at the first surface and a second one of the external contacts being connected to an integrated circuit in the integrated circuit die. Each integrated circuit die also has a third contact at the second surface, the third contact providing, with the via and the first contact, an electrical signal path for coupling electrical signals through the integrated circuit die.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 1A-1H show an apparatus having integrated circuit dies at various stages of manufacture as may be implemented in accordance with one or more embodiments, in which:

FIG. 1A shows the apparatus with a wafer having integrated circuit dies therein, each die having one or more through-die vias;

FIG. 1B shows the apparatus with lanes formed between respective dies;

FIG. 1C shows the apparatus with a mold and tape applied;

FIG. 1D shows the apparatus with a portion of the back side of the wafer removed, exposing both the lanes and vias;

FIG. 1E shows the apparatus in FIG. 1D with circuitry/contacts formed thereon;

FIG. 1F shows the apparatus in FIG. 1E with an external circuit on each die and coupled to the vias therein;

FIG. 1G shows the apparatus in FIG. 1E with another mold encapsulating the external circuit and, with the previously-applied mold, each die; and FIG. 1H shows packages, each having one of the dies and one of the external circuits coupled thereto;

Figure 1A:
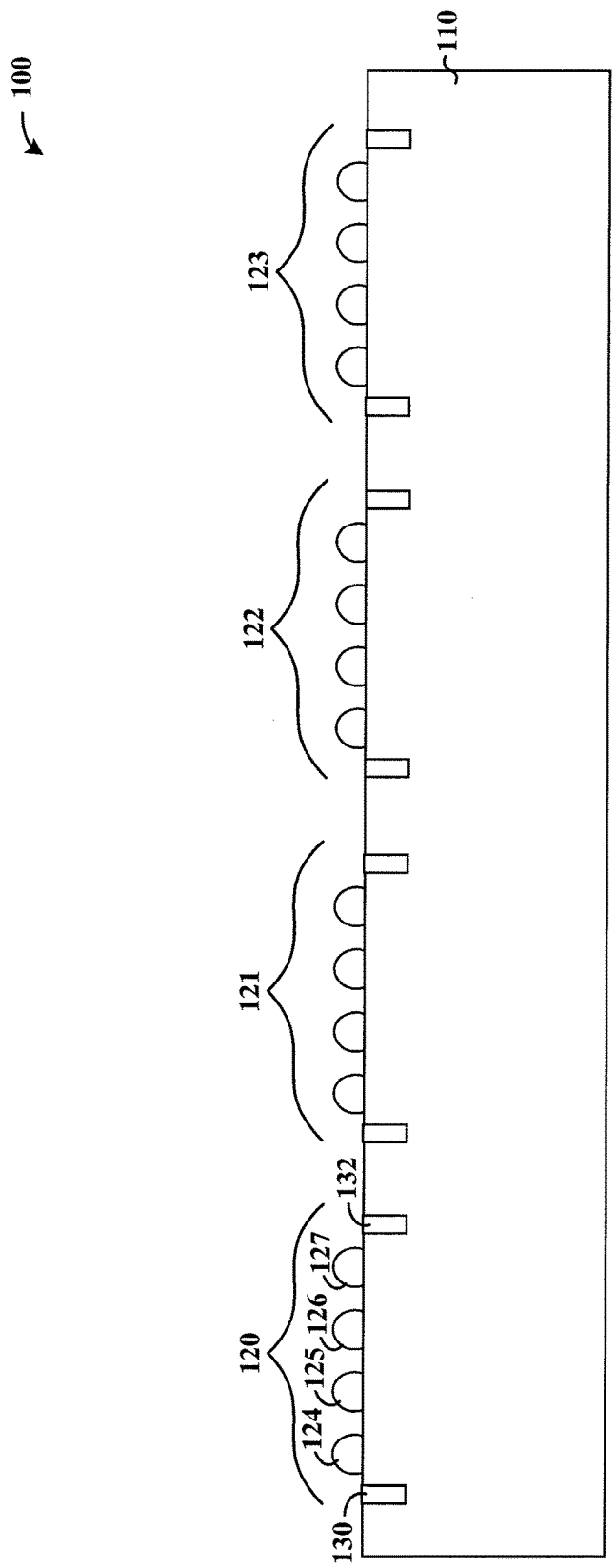

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving integrated circuit dies with an additional die or other circuit coupled (stacked) therewith. In certain implementations, aspects of the present disclosure have been shown to be beneficial when used in the context of wafer level chip scale packaging, with individual dies and stacked circuits therewith being provided in an encapsulated form with electrical access being provided both to and through the dies. In some embodiments, this approach involves the formation of one or more vias through each die during manufacture of a plurality (or multitude) of dies within a wafer while using a back side of the wafer to support the dies. These and other aspects can be implemented to address challenges, including those discussed in the background above and others related to the manufacture and implementation of such circuitry. While not necessarily so limited, various aspects may be appreciated through a discussion of examples using such exemplary contexts.

A more particular embodiment is directed to a method as follows. Two or more integrated circuit dies are provided in a semiconductor wafer, in which each integrated circuit die has circuitry within the die, a pass-through via extending through the die, and electrical contacts on a first surface of the die. One of the contacts is coupled to the via and another one of the contacts is coupled to circuitry in the die. Lanes are created in portions of the semiconductor wafer between the dies, and a portion of the semiconductor wafer (e.g., at a backside) is removed to expose the lanes. A third contact is provided to each via at a second surface of the die, such as by forming a contact on the second surface after removal of the portion of the wafer, or by simply exposing the via when doing so. This third contact is operable with the via and the first contact to provide an electrical signal path for coupling electrical signals through the integrated circuit die. In various contexts, this signal path bypasses other circuitry within the die, providing for electrical access to both the integrated circuit and another circuit stacked upon the die (utilizing the first and second electrical contacts). In various embodiments, the vias can be formed through the dies such that they are electrically insulated from other circuitry within the dies, thus bypassing circuitry therein.

As noted above, various embodiments are directed to providing an apparatus having a plurality of integrated circuit dies in a wafer, which can then be used in subsequent processing by stacking one or more of a variety of different types of circuits. In various such embodiments, an external circuit can be connected to a third contact as noted above (which may be the exposed via itself), with the external circuit being separate from the die and coupled therewith to pass signals through the electrical signal path.

In one or more embodiments (as may also be implemented with the above), the dies are encapsulated with the external circuits, using an encapsulation material (e.g., epoxy) that extends around the integrated circuit dies and within the lanes. This encapsulation material may be formed all at once, or in different steps. For instance, an encapsulant can be formed to support contacts and the IC dies before coupling of external circuits (and, for example, before a wafer thinning step to add support), with a subsequent encapsulant formed after the external circuits are connected. After encapsulating the dies and the external circuits, each die/external circuit pair may be separated by sawing through the encapsulation in the lanes. The resulting package provides electrical access to the integrated circuit die and the external circuit via the contacts at the first surface of the integrated circuit die, which can further involve mounting the stacked package to a circuit board via the underside of the die.

A variety of electrical connectors may be formed in or on a surface of the respective dies, to facilitate coupling of the vias and/or of circuitry within the die. For instance, an electrical connector may be coupled to the via and to the first contact at the first surface, such as by forming a connector on the first surface extending between the via (exposed) and a contact such as a solder bump. Similarly, a contact can be formed to connect the via and a contact on the second surface. Contacts on the second surface and circuitry within the die can then be connected to an underlying circuit board via the contacts on the first surface.

Another embodiment is directed to an apparatus, which may be formed using one or more methods as characterized herein. In such embodiments, an apparatus may include two or more dies in a semiconductor wafer, with each die being separated from other dies in the wafer by lanes. Each die has an integrated circuit within, between surfaces of the die that oppose one another, and one or more vias extend through the die from surface to surface. Each die has external contacts, which may be a contact to the via (such as the exposed via itself) and a contact to the circuitry in the die on one surface, and at least a contact to the via (or the via itself) at an opposing surface that forms a path through the die, with the via and/or other contacts thereto. In this context the vias can be electrically insulated from other circuitry within the die. Various electrical connectors or other circuits, such as antennas, can be formed on one or more surfaces of the die.

The apparatus may further include an external/additional circuit stacked with the die and coupled to one of the external contacts on the die. This external circuit can operate independently from the die, passing signals through the via(s). In further embodiments, the apparatus also includes a circuit board to which the dies are coupled, with the external circuits being coupled to the circuit board through the vias in the dies.

An encapsulation material may be used to encapsulate each die and external circuit coupled thereto, as consistent with the above. For instance, the encapsulation may extend around the dies and within the lanes, with electrical access to the die and the external circuit provided via the contacts at the surfaces of the integrated circuit die.

Figure 1B:
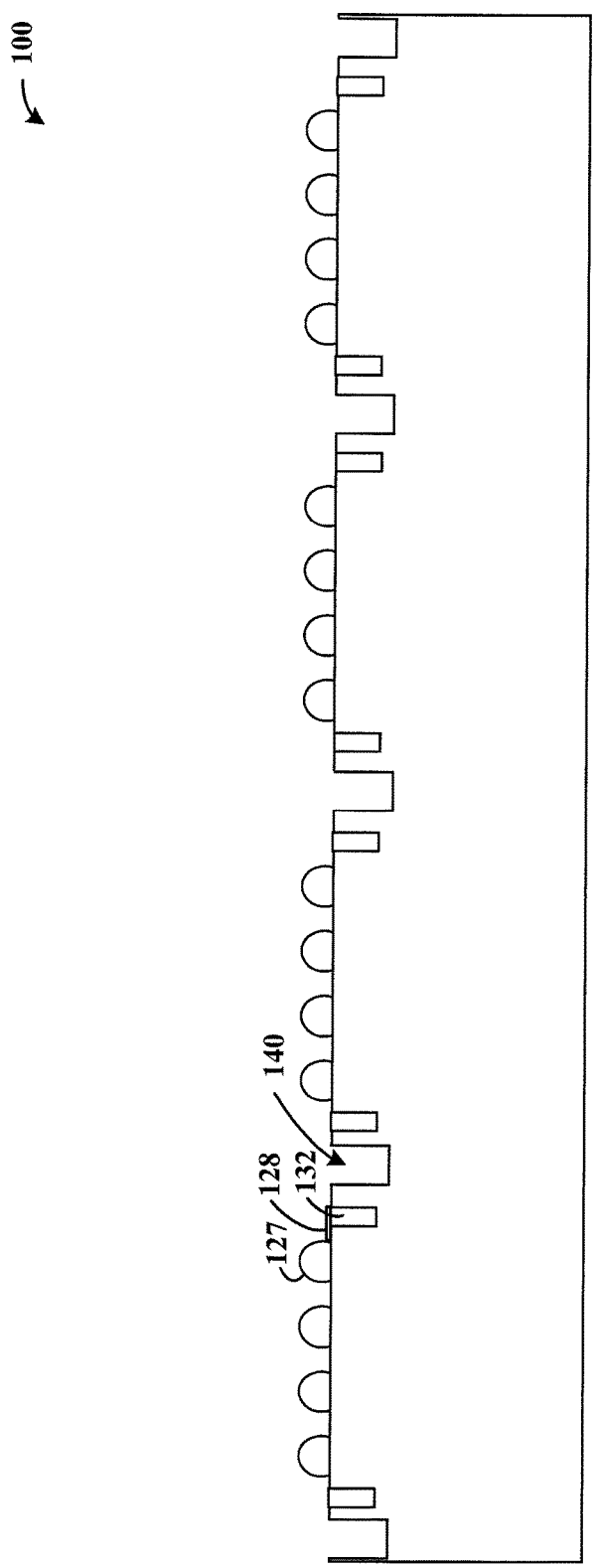
Figure 1C:
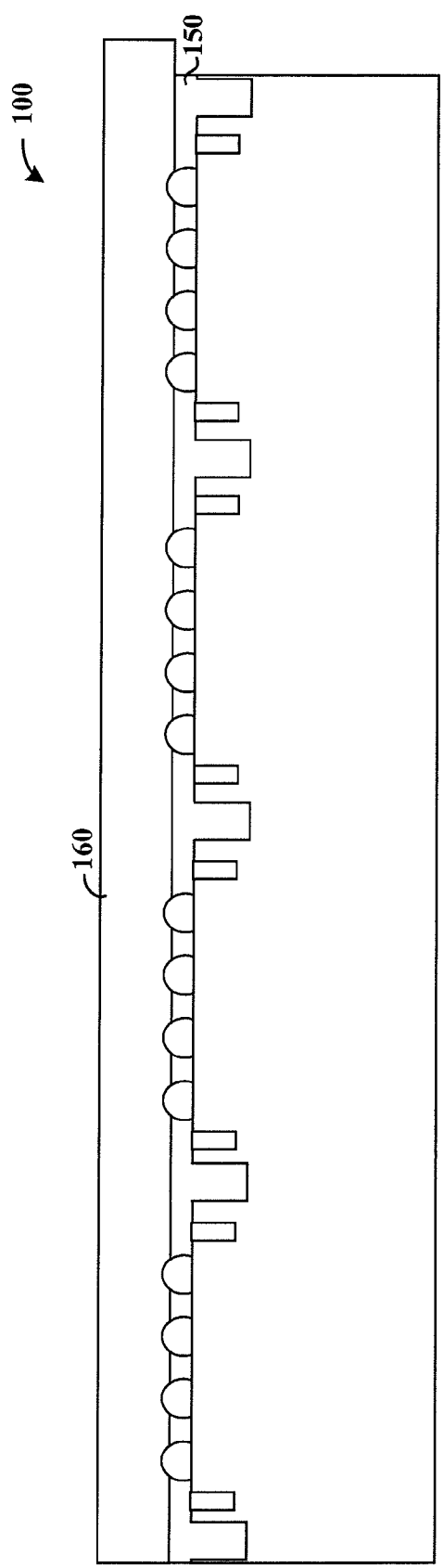
Figure 1D:
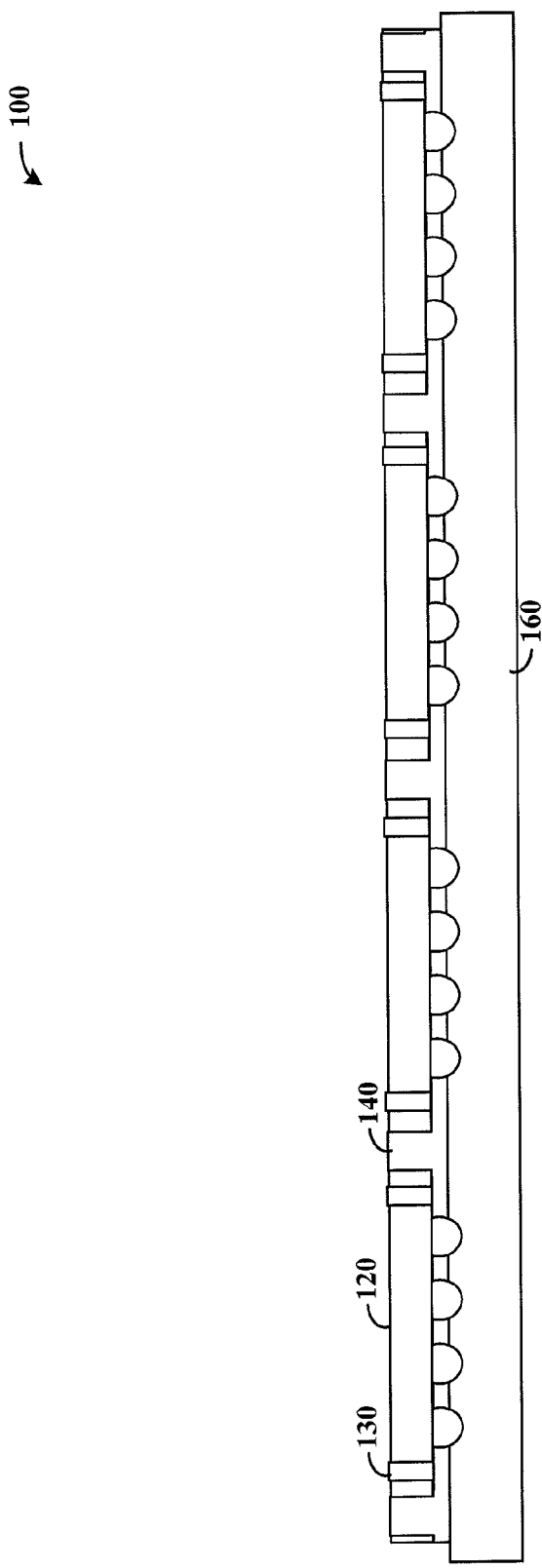

Turning now to the Figures, FIGS. 1A-1H show an apparatus at various stages of manufacture, as may be implemented in accordance with one or more embodiments. Various embodiments are directed to the apparatus as shown at certain stages of manufacture, such as with integrated circuit dies prepared for coupling to one or more of a variety of further/external circuits. One such embodiment is shown in FIG. 1D, and another in FIG. 1E. Such apparatuses can be provided (e.g., as part of a manufacturing process, shipped, or stored) for subsequent coupling to a variety of different types of additional circuits, including those characterized herein as well as others. Additional circuits, in this context, may include one or more different types of integrated circuits such as flip-chip dies, wire-bonded dies, copper stacked dies, secure element circuits that operate independently for maintaining security data, near-field circuits and multi-stacked dies (e.g., with two or more dies stacked on a wafer-level die).

Some embodiments may be implemented to achieve various applications, such as near-field communications (NFC) applications in which stacked circuitry can be desirable. For instance, in mobile payment applications, separate, secure circuitry is often desirable to protect payment data from unauthorized access. This can be implemented with what is often referred to as a secure element, including circuitry that operates independently from a main processor of a device such as a mobile phone. Such circuitry can be provided in a stacked environment using a through-die via as characterized herein to provide select communications with underlying circuitry. A particular implementation (which may also be used in mobile payment) involved a stacked structure of a die with an antenna thereupon. The antenna can be formed on the die and coupled to underlying circuitry through a through-die via. This can be used, for example, to provide multiple layers of circuitry (e.g., two stacked dies) with an antenna on top, using the through-die via to connect the antenna to an underlying one of the stacked dies. An epoxy or other layer can be formed on dies in this context, with additional circuitry such as one of the dies or an antenna formed on the epoxy/other layer, which can provide for mounting, stress relief/prevention and electrical insulation. Various such embodiments may be carried out in accordance with the PN65T, PN547, PN548 (and related) componentry provided by NXP Semiconductors of Eindhoven, The Netherlands, and with one or more approaches characterized in "NFC Everywhere," document order number 9397 750 17634, released February 2015 in publication by NXP Semiconductors, which are fully incorporated herein by reference. Such additional circuits may also be implemented as or with an antenna, such as may be formed on a surface of the integrated circuit die.

Beginning with FIG. 1A, a cross-section of an apparatus 100 is shown with a wafer 110 having a plurality of integrated circuit dies therein, with dies 120, 121, 122 and 123 labeled by way of example. Each die has one or more through-die vias, with vias 130 and 132 labeled for die 120. Further, each die is provided with external contacts, with contacts 124, 125, 126 and 127 for die 120 labeled by way of example. These contacts may, for instance, be coupled to integrated circuitry within each die and/or to one or more of the vias 130 and 132 (e.g., as consistent with the examples described and shown later herein). In this context, each die can be coupled to an external circuit board, in a similar manner as may be implemented in flip chip and/or other technologies.

The wafer 110 may, for example, be a semiconductor wafer with a multitude of individual integrated circuits formed therein, with each circuit being designed to operate individually. In this context, the cross-sectional view in FIG. 1A may be of a portion of such a wafer, which may include a multitude of individual dies arranged as shown or otherwise. Various aspects of this disclosure are further directed to manufacturing such integrated circuits as well. Such an approach can be implemented with what is often referred to as wafer-level chip scale processing. This approach facilitates efficient manufacture of the respective dies, and can be implemented to provide resulting packages that are compact.

FIG. 1B shows the apparatus 100 of FIG. 1A, with lanes formed between respective dies. Lane 140 is shown by way of example, which provides a physical separation between adjacent dies. The lanes can be formed while utilizing underlying material of the wafer 110 to support the dies, which can mitigate issues such as those relating to die cracking and other problems. This approach can also address challenges relating those characterized in the Overview above.

A connector 128 is also shown connecting the via 132 to contact 127. This approach can be useful for providing a through-die connection that may also bypass integrated circuitry within the die, which can be useful for coupling signals to connected circuits in a stacked arrangement. The connector 128 can also be implemented within the underlying die as shown, such as may be formed using a metallization process.

FIG. 1C shows the apparatus 100 with a mold 150 and adhesive material 160 applied as shown. In some implementations, adhesive material 160 is implemented with a compliant material that adheres to the respective contacts as shown, with sufficient structure to hold the respective dies in place relative to one another during subsequent processing. In various contexts, the adhesive material 160 is a tape having an adhesive thereon, and can be implemented with a dicing tape, grinding tape or other types of manufacturing tape. In other implementations, the adhesive material 160 is omitted. In various implementations; the mold 150 can be omitted or implemented in other manners, and later steps may involve forming a mold extending into the lanes as shown.

FIG. 1D shows the apparatus 100, flipped in orientation and with a portion of the back side of the wafer 110 removed, using the adhesive material 160 to support the dies. As shown here, the lanes (including lane 140) and vias (including via 130) are shown as being exposed by way of example. In various implementations, more or less of the wafer is removed, to suit applications. For instance, a small amount of wafer material may be left intact over vias, and the vias may be subsequently connected by forming of a contact in the surface, or other approach.

Figure 1E:
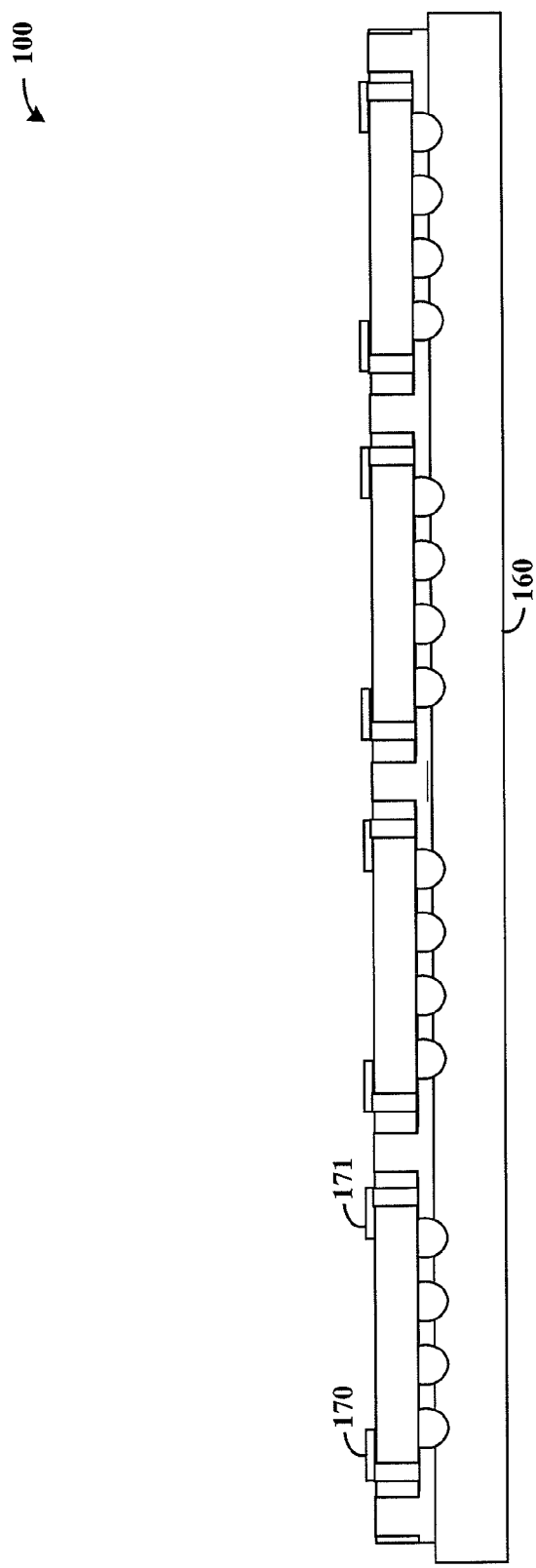

FIG. 1E shows the apparatus 100 in FIG. 1D with circuitry/contacts formed thereon, including contacts 170 and 171 shown by way of example. In some implementations, the circuitry/contacts are formed as an antenna on an upper surface of each die as shown. In certain embodiments, an additional layer of material is formed on the upper surface of each die, before formation of the additional circuitry/ contact. For instance, an epoxy layer may be formed on the upper surface of each die, and an additional circuit such as an antenna or another die can be formed or provided on the epoxy. Such an additional layer could be used, for example, to accommodate stress by matching or offsetting thermal expansion that may be imparted to the die by unremoved portions of the wafer or other encapsulation material on an opposing surface or surfaces. In other implementations, the contacts 170 and 171 are integrated within the upper surface. The apparatus 100 can be utilized in this manner, as a base upon which a variety of different circuits can be coupled to the contacts thereon.

Figure 1F:
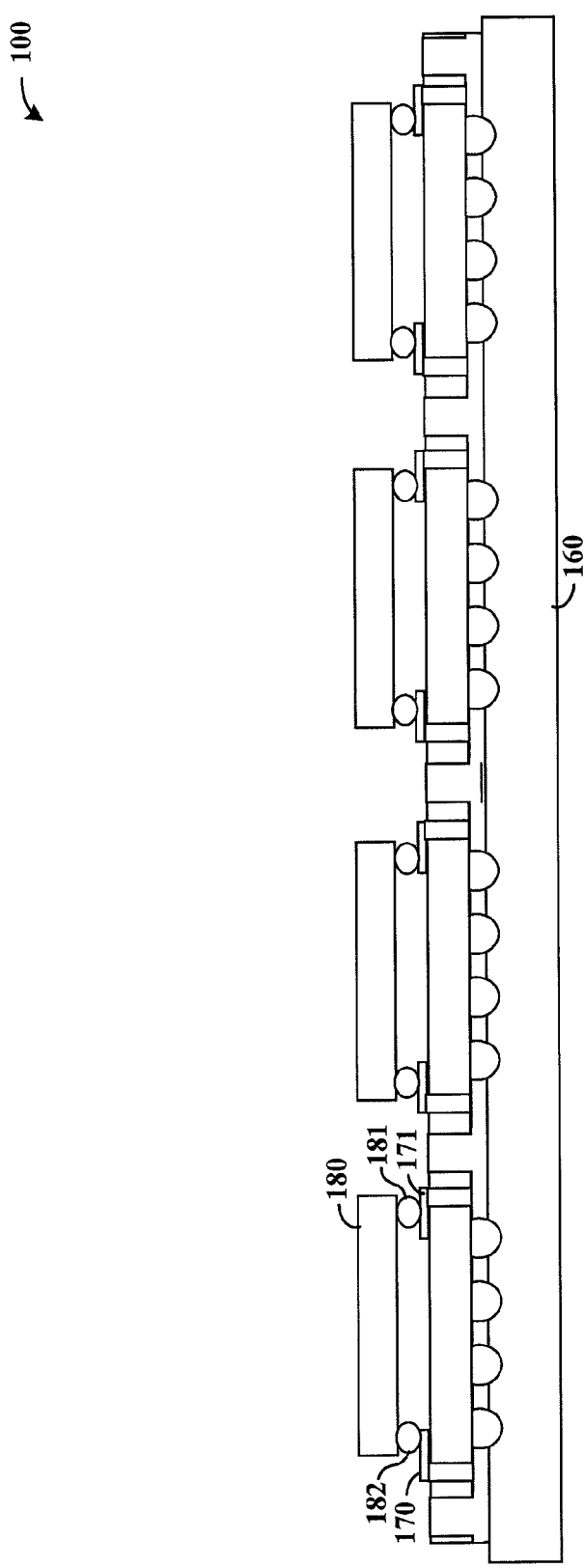

FIG. 1F shows the apparatus in FIG. 1E with an example type of external circuit on each die, coupled to the vias therein. A multitude of different circuits may be coupled in this regard, and the circuit may involve a flip-chip die. Circuit 180 is shown coupled to contacts 170 and 171 by contacts (e.g., bumps) 181 and 182. Additional contacts may be made in similar manners.

Figure 1G:
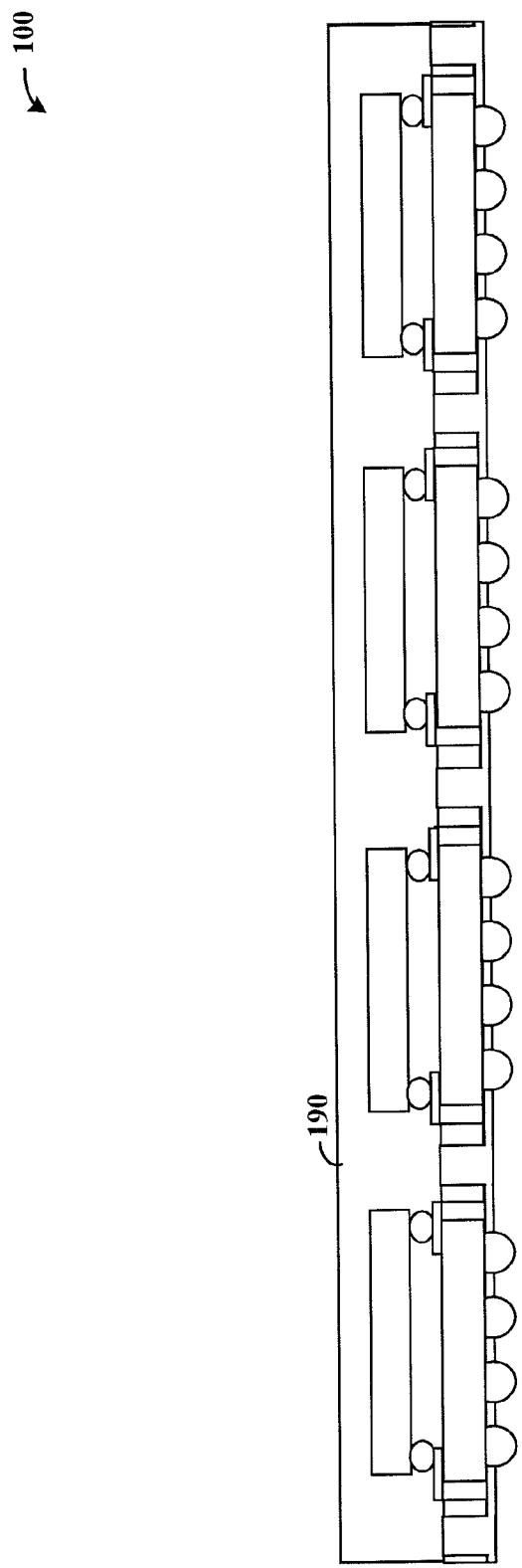

FIG. 1G shows the apparatus 100 in FIG. 1E with a mold 190 encapsulating the external circuits and each die. In some embodiments, mold 150 as shown in FIG. 1C is maintained and utilized with the embodiment shown in FIG. 1G. In other implementations, the mold 190 is used in the lanes, with the mold 150 being omitted. The molding may, for example, be carried out with the adhesive material 160 left in place as support, after which it may be removed as shown in FIG. 1G.

Figure 1H:
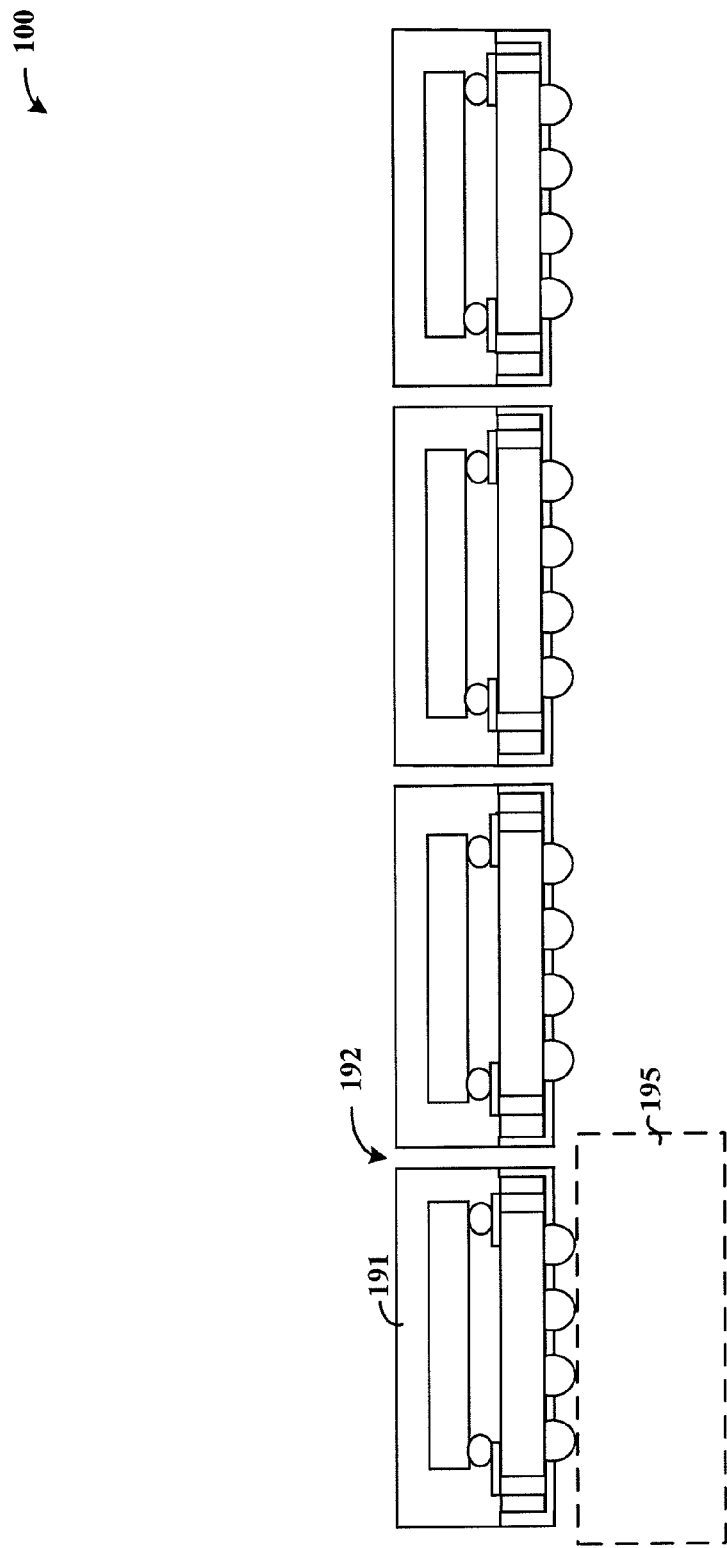

In these instances, the resulting structure involves an encapsulated, stacked set of circuits that can be individually separated and implemented. FIG. 1H shows individual packaged circuits including circuit 191 labeled by way of example, separated from adjacent circuits by lanes. Lane 192 is labeled by way of example, and is shown extending through the mold material(s) as may be used in accordance with embodiments herein. Each packaged circuit includes one of the dies and one of the external circuits coupled thereto. This step may also be carried out with the adhesive material 160 left in place, through the step shown in FIG. 1G. In some implementations, one or more of the resulting packaged circuits may be coupled to a circuit board, as represented at 195. Contacts on the die 191 may, for example, be connected to contact pads on the circuit board 195.

Figure 2:
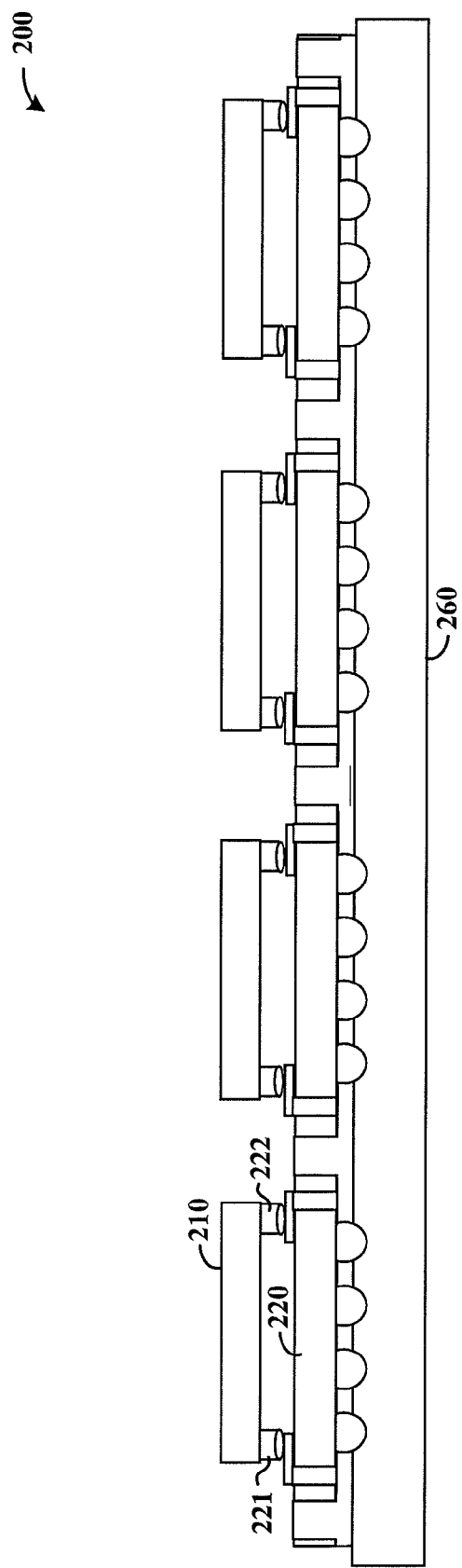
FIG. 2 shows an embodiment in which copper pillar external circuits are provided to IC dies formed from a wafer, as may be implemented in accordance with one or more embodiments.
Figure 3:
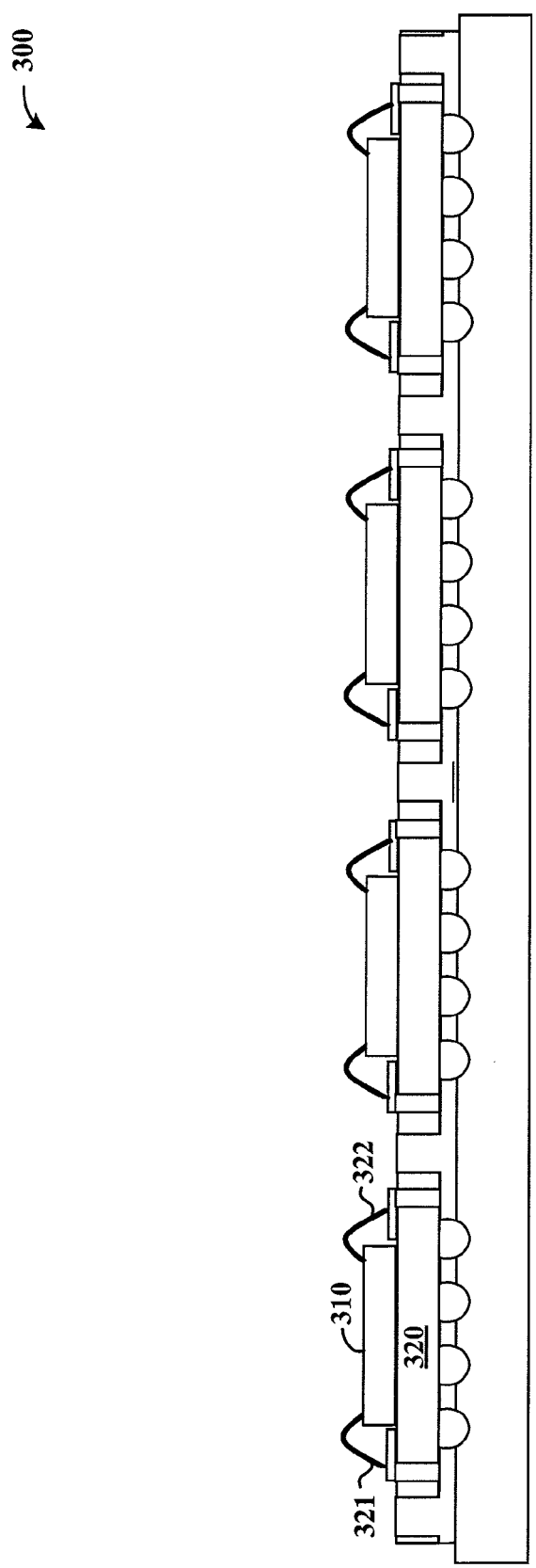
FIG. 3 shows an embodiment in which wire-bonded external circuits are provided to IC dies formed from a wafer, as may be implemented in accordance with one or more embodiments.
Figure 4:
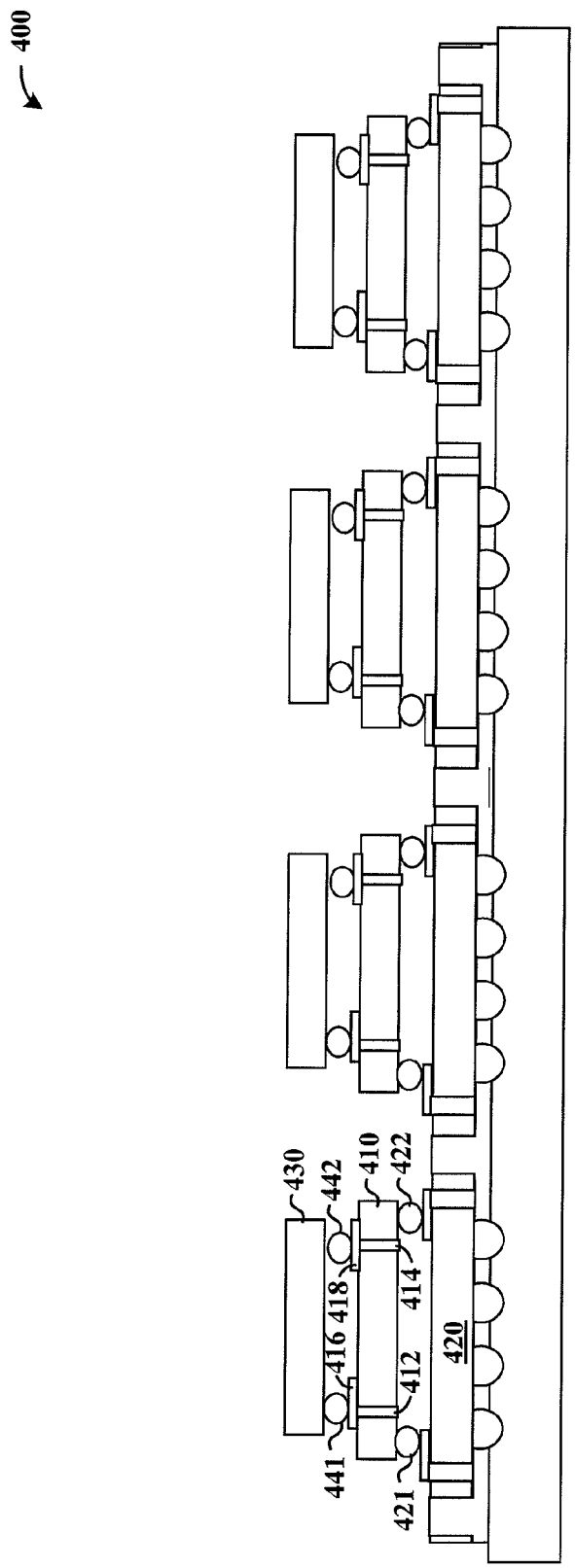
FIG. 4 shows an embodiment in which multiple stacked external circuits are coupled to IC dies formed from a wafer, as may be implemented in accordance with one or more embodiments.

As noted herein, a variety of additional circuits may be mounted on and coupled to through-die vias in an underlying chip. FIGS. 2-4 show various such embodiments. Each of these embodiments may be combined in multiple stacked structures, such as with stacked componentry from two or more of FIGS. 2-4. In FIG. 2, an apparatus 200 includes copper pillar external circuits stacked on IC dies formed from a wafer, as may be implemented in accordance with one or more embodiments. By way of example, circuit 210 is shown coupled via copper pillar connectors 221 and 222. The embodiment shown in FIG. 2 may, for example, be implemented with the approaches shown to arrive at FIG. 1F, consistent with the above discussion. For instance, an underlying tape 260 can be used to hold individual chips, including die 220, in place during processing in which the additional circuit 210 is coupled to through-die vias in the die 220.

FIG. 3 shows another embodiment in which an apparatus 300 includes wire-bonded external circuits coupled to IC dies formed from a wafer, as may be implemented in accordance with one or more embodiments. By way of example, IC die 310 is shown mounted to die 320, via wire bonds 321 and 322.

FIG. 4 shows an embodiment in which an apparatus 400 includes multiple stacked external circuits coupled to IC dies formed from a wafer, as may be implemented in accordance with one or more embodiments. By way of example, circuits 410 and 430 are shown stacked on die 420, formed in a wafer in a manner such as characterized herein. Contacts 421 and 422 couple the circuit 410 to vias in die 420. Vias 412 and 414 couple circuit 430 to die 420, by way of contacts 441 and 442 as well as contacts 416 and 418. Interconnections between the respective circuits can be made in a variety of manners, such as by implementing conductors that couple via 414 with contact 422 into the circuit 410 and/or on a lower surface thereof.

The skilled artisan would recognize that various terminology as used herein, in the Specification (including claims) connote a plain meaning in the art unless otherwise indicated. As examples, the Specification describes and/or illustrates aspects useful for implementing the claimed invention by way of various blocks, modules, antennas, stacked dies and/or other circuits as well as manufacturing approaches which exemplify how certain embodiments may be carried out in the form or structures, steps, functions, operations, activities, etc. In these contexts, a "block" (also sometimes "logic circuitry" or "module") is a circuit that carries out one or more of these or related operations/ activities (e.g., of the various stacked componentry depicted in the figures and described herein). For example, in certain of the above-discussed embodiments, one or more modules are discrete logic circuits or programmable logic circuits configured and arranged for implementing these operations/ activities, as may be carried out in the approaches shown in the Figures. In certain embodiments, such a programmable circuit is one or more computer circuits, including memory circuitry for storing and accessing a program to be executed as a set (or sets) of instructions (and/or to be used as configuration data to define how the programmable circuit is to perform). For instance, such a programmable circuit may be implemented to carry out an algorithm or process as described in connection with the various method-based steps characterized with FIGS. 1A-1H. Depending on the application, instructions (and/or configuration data) can be configured for implementation in logic circuitry, with the instructions (whether characterized in the form of object code, firmware or software) stored in and accessible from a memory (circuit). As another example, where the Specification may make reference to terminology such as a "first

[type of structure]", a "second [type of structure]", where the type of structure might be replaced with terms such as "circuit," "contact," and "surface," the adjectives "first" and "second" are not used to connote any description of the structure or to provide any substantive meaning; rather, such adjectives are merely used for English-language antecedence to differentiate one such similarly-named structure from another similarly-named structure (e.g., "first contact . . . " is interpreted as an electrical "contact . . . ").

Based upon the above discussion and illustrations, those skilled in the art will readily recognize that various modifications and changes may be made to the various embodiments without strictly following the exemplary embodiments and applications illustrated and described herein. For example, an apparatus can include different types of stacked circuits and configurations, including those shown in the Figures (which may be combined), and circuits and configurations other than those illustrated by the Figures. Vias and other componentry can be manufactured in a variety of manners. Such modifications do not depart from the true spirit and scope of various aspects of the invention, including aspects set forth in the claims.

What is claimed is:

1. A method comprising:
    providing a plurality of integrated circuit dies in a semiconductor wafer, each integrated circuit die having an integrated circuit within the die, having a via extending from a first surface to a second surface that opposes the first surface, and having first and second electrical contacts at the first surface respectively coupled to the via and to the integrated circuit;
    removing portions of the semiconductor wafer between the dies, thereby forming lanes between the dies; and
    removing a portion of the semiconductor wafer to expose the lanes and with, for each integrated circuit die, a third contact to the via being provided at the second surface, the third contact being configured and arranged with the via and the first contact to provide an electrical signal path for coupling electrical signals through the integrated circuit die.

2. The method of claim 1, further including, for each integrated circuit die, coupling an external circuit to the third contact, the external circuit being separate from the integrated circuit die and configured and arranged to pass signals through the electrical signal path.

3. The method of claim 2, further including:
    after coupling the external circuits, encapsulating the integrated circuit dies and the external circuits with an encapsulation material that extends around the integrated circuit dies and within the lanes; and
    after encapsulating the integrated circuit dies and the external circuits, for each integrated circuit die, separating the integrated circuit die and the external circuit coupled thereto by sawing through the lanes, therein providing electrical access to the integrated circuit die and the external circuit via the first and second contacts at the first surface of the integrated circuit die.

4. The method of claim 3, further including, for each integrated circuit die, coupling the integrated circuit and the external circuit connected to the integrated circuit die to an underlying circuit board via the first and second contacts.

5. The method of claim 1, further including, for each integrated circuit die, forming an electrical connector at the first surface, the electrical connector being coupled to the via and to the first contact.

6. The method of claim 5, further including, for each integrated circuit die, coupling the integrated circuit and the third contact to an underlying circuit board via the first and second contacts.

7. The method of claim 1, further including, for each integrated circuit die, forming an electrical connector at the second surface, the electrical connector being coupled to the via and to an electrical contact of an external circuit.

8. The method of claim 1, further including forming the vias through the integrated circuit dies with the via being electrically insulated from the integrated circuits within the integrated circuit dies, therein providing a circuit path through each integrated circuit die that bypasses the integrated circuit within the integrated circuit die.

9. The method of claim 1, further including forming an antenna on the first surface, coupled to the via by the first contact.

10. A method comprising:
    forming a plurality of integrated circuit dies in a semiconductor wafer;
    for each integrated circuit die,
        forming a via extending from a first surface of the die into the integrated circuit die, and
        forming a plurality of electrical contacts at the first surface, a first one of the electrical contacts being coupled to the via and a second one of the electrical contacts being coupled to an integrated circuit in the integrated circuit die;
    removing portions of a front side of the wafer between the dies, thereby creating lanes in the wafer;
    removing a portion of a back side of the semiconductor wafer and therein exposing a second surface of each integrated circuit die that opposes the first surface, the via being exposed at the second surface; and
    for each integrated circuit die, coupling a further circuit to the via at the second surface, the further circuit being separate from the integrated circuit die and coupled to the first one of the electrical contacts by the via, therein providing an electrical signal path for coupling electrical signals between the first one of the electrical contacts at the first surface and the further circuit at the second surface.

11. The method of claim 10, further including
    encapsulating each integrated circuit die and the further circuit coupled thereto with an encapsulation material that extends around the integrated circuit dies and within the lanes; and
    after encapsulating the integrated circuit dies and the further circuits, for each integrated circuit die, separating the integrated circuit die and the further circuit coupled thereto by sawing through the encapsulation material in the lanes, therein providing electrical access to the encapsulated integrated circuit die and the further circuit via the first and second contacts at the first surface of the integrated circuit die.

12. The method of claim 11, further including, for each integrated circuit die, coupling the integrated circuit and the further circuit connected to the integrated circuit die to an underlying circuit board via the first and second contacts.

* * * * *